(12) United States Patent
Lin et al.

(10) Patent No.: US 12,156,391 B2
(45) Date of Patent: Nov. 26, 2024

(54) SIGNAL ISOLATION DEVICE

(71) Applicants: Inventec (Pudong) Technology Corporation, Shanghai (CN); INVENTEC CORPORATION, Taipei (TW)

(72) Inventors: Hsin-Hung Lin, Taipei (TW); Wei-Chen Cheng, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 394 days.

(21) Appl. No.: 17/653,463

(22) Filed: Mar. 3, 2022

(65) Prior Publication Data

US 2023/0156988 A1    May 18, 2023

(30) Foreign Application Priority Data

Nov. 12, 2021 (CN) .......................... 202111339306.6

(51) Int. Cl.
*H05K 9/00* (2006.01)
*H01Q 1/52* (2006.01)

(52) U.S. Cl.
CPC ............. *H05K 9/0088* (2013.01); *H01Q 1/52* (2013.01)

(58) Field of Classification Search
None
See application file for complete search history.

(56) References Cited

U.S. PATENT DOCUMENTS

| 8,149,593 | B2 * | 4/2012 | Kiyota | H01L 23/552 |
| | | | | 174/385 |
| 9,960,859 | B2 * | 5/2018 | Yi | H04B 5/70 |
| 2008/0158091 | A1 * | 7/2008 | Imaoka | H01Q 1/38 |
| | | | | 343/851 |
| 2015/0303562 | A1 * | 10/2015 | Chen | H01Q 1/526 |
| | | | | 29/601 |
| 2018/0205143 | A1 * | 7/2018 | Sy | H01Q 1/52 |
| 2020/0194378 | A1 | 6/2020 | Tang et al. | |

FOREIGN PATENT DOCUMENTS

| CN | 101795552 A | 8/2010 |
| TW | I626793 B | 6/2018 |

* cited by examiner

*Primary Examiner* — Vladimir Magloire
*Assistant Examiner* — David C. Schultz
(74) *Attorney, Agent, or Firm* — CKC & Partners Co., LLC

(57) ABSTRACT

A signal isolation device includes an insulation layer, at least one metal foil unit, and a metal layer. The at least one metal foil unit is disposed on a top surface of the insulation layer, and the metal foil unit has a first recessed channel and a second recessed channel. The first recessed channel and the second recessed channel spirally extend inward from an edge of the metal foil unit, and the first recessed channel and the second recessed channel surrounding each other are spaced apart. The metal layer is disposed on a bottom surface of the insulation layer.

17 Claims, 6 Drawing Sheets

SIGNAL ISOLATION DEVICE

CROSS-REFERENCE TO RELATED APPLICATION

This application claims priority to China Application Serial Number 202111339306.6, filed Nov. 12, 2021, which is herein incorporated by reference in its entirety.

BACKGROUND

Field of Invention

The present invention relates to a signal isolation device.

Description of Related Art

Wireless Wide Area Network (WWAN) has been widely used for many years from the first generation mobile communication to the third generation mobile communication. The fifth generation mobile communication provides Sub-6G frequency band and Wi-Fi 6E frequency band, and Wireless Wide Area Network (WWAN) is unreplaceable. Regardless of whether it is a formal or emergency telephone call, a modem with low bandwidth and low power consumption is still highly demanded.

In comparison with Wifi Wireless Local Area Network (WLAN), the frequency bands of Wireless Wide Area Network (WWAN) are mostly at low frequencies which are about 800 MHz~1.9 GHz in the frequency spectrum. Due to the longer wavelength and larger size of radio frequency components, light and thin products has dominated the evolution trend of consumer electronics products related to smart phones and notebook computers. Therefore, under the limited space, manufactures have to follow the evolution trends, and it is more difficult to design low-frequency radio frequency components.

Therefore, how to provide a signal isolation device that is small in size, simple in process, and capable of suppressing signals in multiple frequency bands has become a research target for private enterprises and academic institutions to invest a lot of money, manpower, and time.

SUMMARY

The invention provides a signal isolation device which includes an insulation layer, at least one metal foil unit, and a metal layer. The at least one metal foil unit is disposed on a top surface of the insulation layer, and the metal foil unit has a first recessed channel and a second recessed channel. The first recessed channel and the second recessed channel spirally extend inward from an edge of the metal foil unit, and the first recessed channel and the second recessed channel surrounding each other are spaced apart. The metal layer is disposed on a bottom surface of the insulation layer.

In some embodiments of the present invention, the metal foil unit is square, and the first recessed channel and the second recessed channel extend from two opposite sides of the metal foil unit respectively.

In some embodiments of the present invention, the first recessed channel has a straight middle portion disposed between a straight head portion and a straight tail portion of the second recessed channel.

In some embodiments of the present invention, the second recessed channel has a straight middle portion disposed between a straight head portion and a straight tail portion of the first recessed channel.

In some embodiments of the present invention, the first recessed channel and the second recessed channel have a plurality of vertical bending portions.

In some embodiments of the present invention, the first recessed channel and the second recessed channel are in a rotational symmetry around a center of the metal foil unit.

In some embodiments of the present invention, the first recessed channel has a width equal to a width of the second recessed channel.

In some embodiments of the present invention, a width of the first recessed channel is from 0.8 mm to 1.2 mm.

In some embodiments of the present invention, the first recessed channel has a portion immediately adjacent to and spaced apart from a portion of the second recessed channel by a minimum distance from 0.8 mm to 1.2 mm.

In some embodiments of the present invention, the signal isolation device further includes additional metal foil units which are immediately adjacent to the metal foil unit and arranged along a row.

In embodiments of the present invention, a signal isolation device is provided, and the signal isolation device includes a single layer board structure. The signal isolation device has outstanding signal isolation ability in various frequency bands with a simple structure. Users can easily adjust the length of the recessed channel in the metal foil of the signal isolation device, and the signal isolation device can provide isolation functions in low frequency bands.

An aspect of the present invention provides a signal isolation device including an insulation layer, a plurality of metal foil units, and a metal layer. The plurality of metal foil units disposed on a top surface of the insulation layer, and each of the metal foil units has a first recessed channel and a second recessed channel. The first recessed channel and the second recessed channel spirally extend inward from an edge of the metal foil unit toward a center of the metal foil unit, and the first recessed channel and the second recessed channel surrounding each other are spaced apart. The metal layer is disposed on a bottom surface of the insulation layer.

An aspect of the present invention provides a signal isolation device including an insulation layer, a plurality of metal foil units, and a metal layer. The plurality of metal foil units are disposed on a top surface of the insulation layer, and one of the metal foil units is in direct contact with another one of the metal foil units. Each of the metal foil units has a first recessed channel and a second recessed channel, and the first recessed channel and the second recessed channel spirally extend inward from an edge of the metal foil unit. The first recessed channel and the second recessed channel surrounding each other are spaced apart. The metal layer is disposed on a bottom surface of the insulation layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
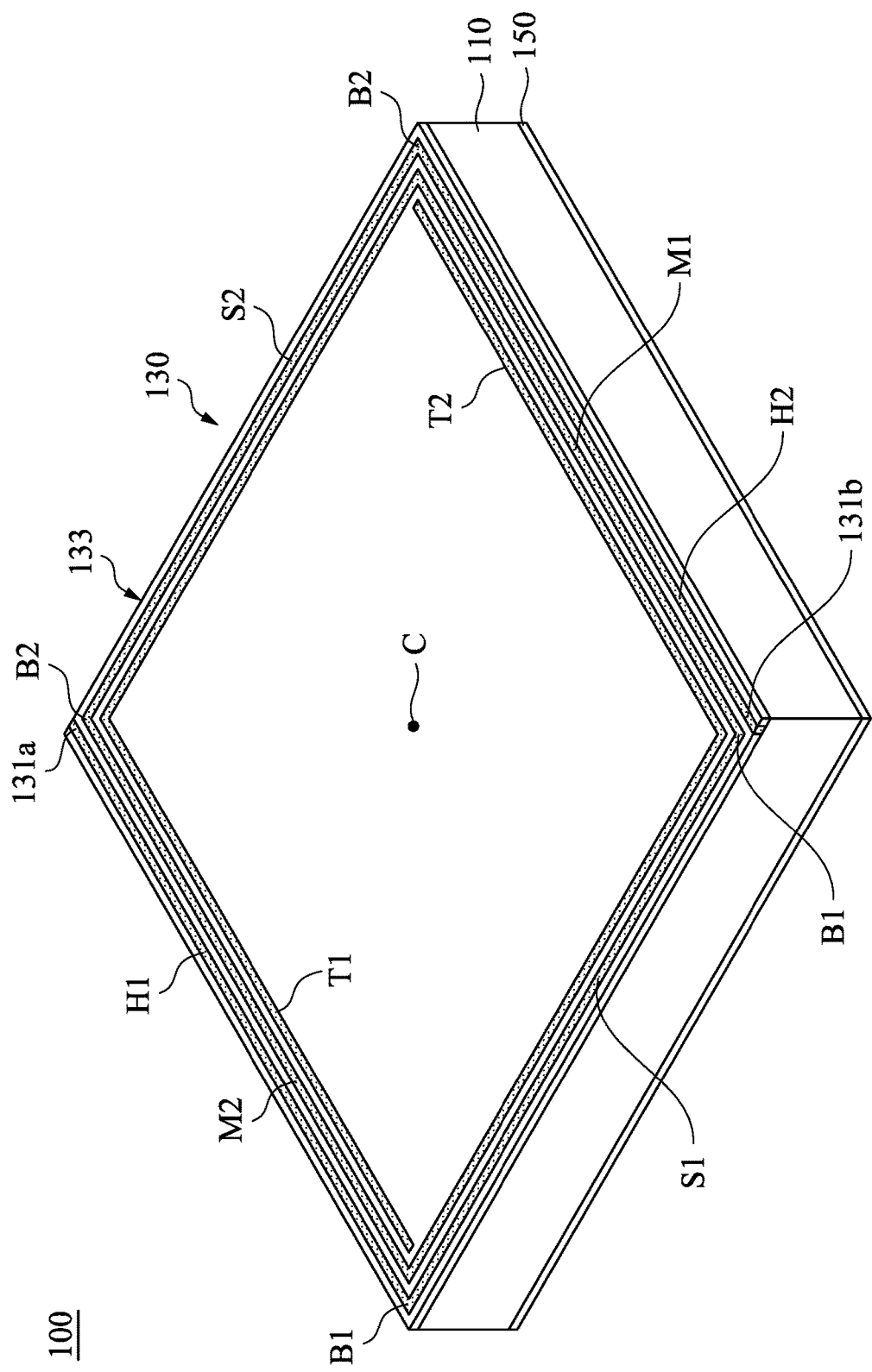
FIG. 1 illustrates a schematic view of a signal isolation device in accordance with some embodiments of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
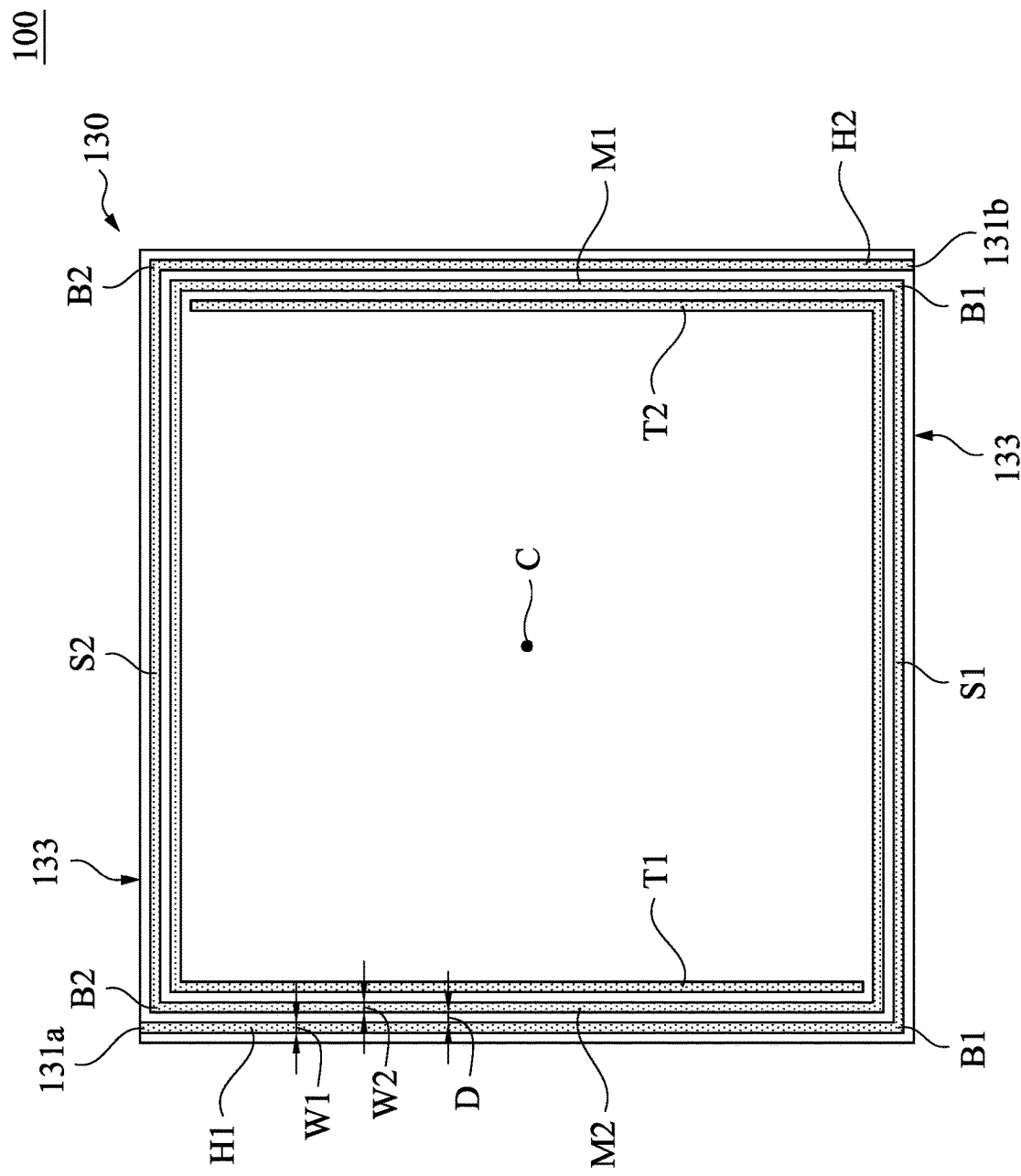
FIG. 2 illustrates a top view of the signal isolation device in accordance with some embodiments of the present invention.

Please refer to FIGS. 1 and 2. FIG. 1 illustrates a schematic view of a signal isolation device 100. FIG. 2 illustrates a top view of the signal isolation device 100. In some embodiments of the present invention, the signal isolation device 100 includes an insulation layer 110, a metal foil unit 130, and a metal layer 150. The metal foil unit 130 is disposed on a top surface of the insulation layer 110, and the metal foil unit 130 includes a first recessed channel 131a and a second recessed channel 131b. The first recessed channel 131a and the second recessed channel 131b extend from an edge 133 of the metal foil unit 130 to extend spirally inward toward a center C of the metal foil unit 130. The first recessed channel 131a and the second recessed channel 131b which extend through the metal foil unit 130 expose the top surface of the insulation layer 110, and the first recessed channel 131 and the second recessed channel 131b which are separated surround each other. Moreover, the metal layer 150 is disposed on a bottom surface of the insulation layer 110, and the first recessed channel 131a and the second recessed channel 131b of the metal foil unit 130 form path features which is benefit for providing outstanding isolation abilities to the signal isolation device 100 in many frequency bands.

In some embodiments of the present invention, the insulation layer 110 can be a printed circuit board (PCB), and the insulation layer 110 can be a printed circuit board in FR4 printed circuit board specification. In addition, the metal foil unit 130 and the metal layer 150 can be made of copper or copper alloy, and the first recessed channel 131a and the second recessed channel 131b of the metal foil unit 130 can be manufactured by an etching process, a laser cutting process, or a machining process. The present invention is not limited in this respect.

In some embodiments of the present invention, the insulation layer 110 is in rectangular shape such as square shape, and the metal foil unit 130 is rectangular or square. The first recessed channel 131a and the second recessed channel 131b extend from two opposite sides or corners of the metal foil unit 130 respectively to extend spirally inward toward a center C of the metal foil unit 130, and the first recessed channel 131a and the second recessed channel 131b are in a rotational symmetry around a center C of the metal foil unit 130. The present invention is not limited in this respect.

In some embodiments of the present invention, the first recessed channel 131a includes a straight head portion H1, a straight middle portion M1, and a straight tail portion T1, and the second recessed channel 131b also includes a straight head portion H2, a straight middle portion M2, and a straight tail portion T2. The straight middle portion M1 communicates between the straight head portion H1 and the straight tail portion T1. The straight middle portion M2 communicates between the straight head portion H2 and the straight tail portion T2. Moreover, the straight middle portion M1 of the first recessed channel 131a is disposed between the straight head portion H2 of the second recessed channel 131b and the straight tail portion T2, so the straight head portion H2 and the straight tail portion T2 of the second recessed channel 131b are respectively disposed at two opposite side of the straight middle portion M1 of the first recessed channel 131a. In addition, the straight middle portion M2 of the second recessed channel 131b is disposed between the straight head portion H1 and the straight tail portion T1 of the first recessed channel 131a, so the straight head portion H1 and the straight tail portion T1 of the first recessed channel 131a are respectively disposed at two opposite sides of the straight middle portion M2 of the second recessed channel 131b. The present invention is not limited in this respect.

In one or more embodiments of the present invention, the first recessed channel 131a includes a plurality of vertical bending portion B1 and a plurality of straight portion S1, in which the vertical bending portions B1 and the straight portions S1 enable the first recessed channel 131a to form a rectangular spiral pattern. For instance, the first recessed channel 131a includes four vertical bending portions B1 and five straight portions S1, and each of the vertical bending portions B1 is disposed between two adjacent ones of the straight portions S1. The second recessed channel 131b includes a plurality of vertical bending portions B2 and a plurality of straight portions S2, and the vertical bending portions B2 and the straight portions S2 are alternately arranged such that the second recessed channel 131b to form a rectangular spiral pattern. For instance, the second recessed channel 131b includes four vertical bending portions B2 and five straight portions S2, and each of the vertical bending portions B2 is disposed between two adjacent ones of the straight portions S2. The present invention is not limited in this respect.

In some embodiments of the present invention, the first recessed channel 131a has a first width W1 equal to a second width W2 of the second recessed channel 131, and the first width W1 of the first recessed channel 131a is from about 0.8 mm to about 1.2 millimeters (mm). For instance, the first width W1 of the first recessed channel 131a is about 1 mm. In addition, the second recessed channel 131b has a second width W2 from about 0.8 mm to about 1.2 mm. For instance, the second width W2 of the second recessed channel 131b is about 1 mm. The present invention is not limited in this respect. When the first width W1 of the first recessed channel 131a and/or the second width W2 of the second recessed channel 131b are from about 0.8 mm to 1.2 mm, the signal isolation device 100 has outstanding isolation ability in various frequency bands. In some embodiments of the present invention, a portion of the first recessed channel 131a is immediately adjacent to and spaced apart from a portion of the second recessed channel 131b by a minimum distance D from about 0.8 mm to about 1.2 mm. For instance, the straight head portion H1 of the first recessed channel 131a is immediately adjacent to and spaced apart from the straight middle portion M2 of the second recessed channel 131b by a minimum distance D from about 0.8 mm to about 1.2 mm, and the straight head portion H1 and the straight middle portion M2 are parallel to each other. In some other embodiments of the present invention, the first width W1 of the first recessed channel 131a is different from the second width W2 of the second recessed channel 131b. The present invention is not limited in this respect.

Figure 3:
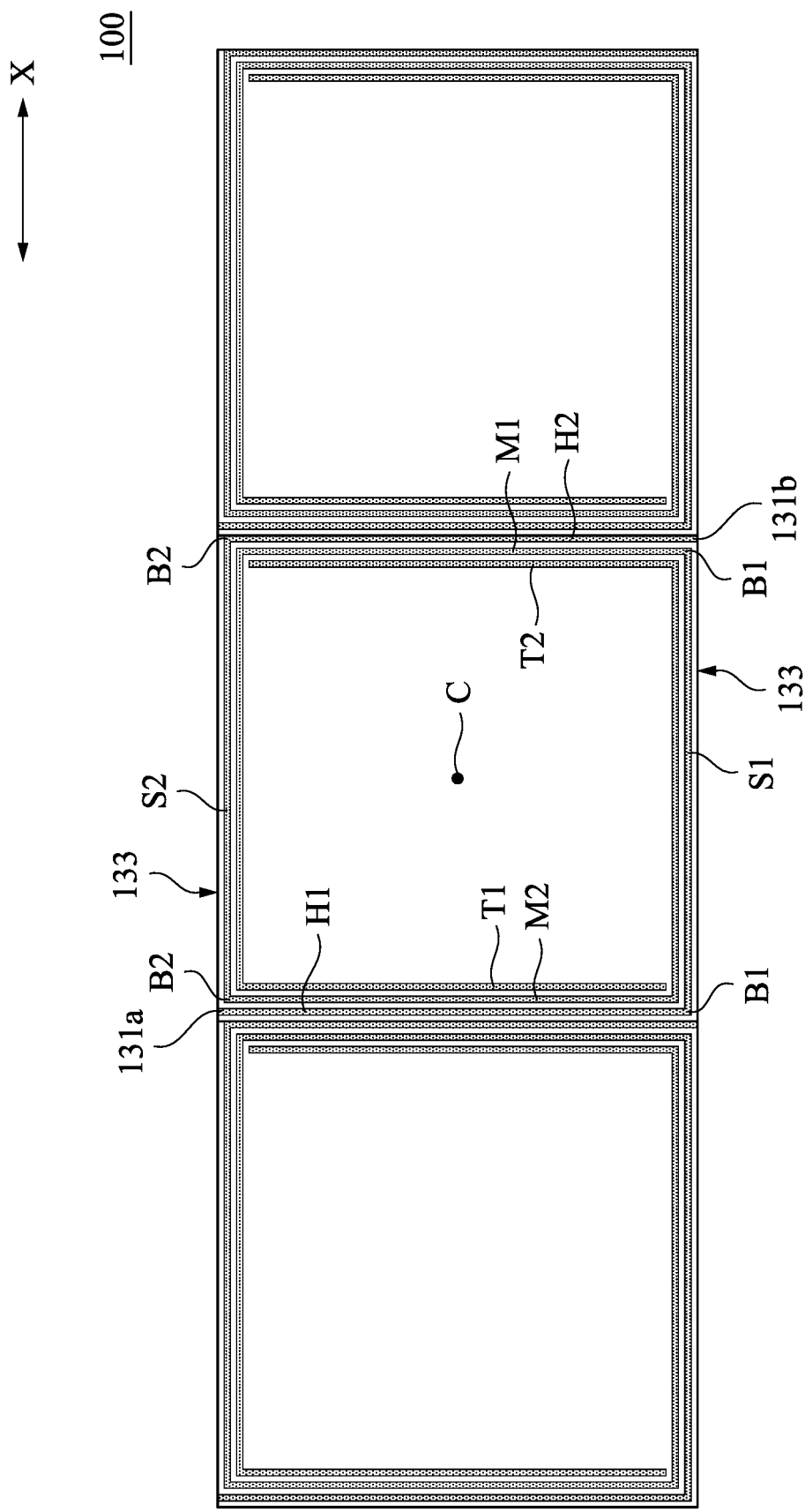
FIG. 3 illustrates a top view of the signal isolation device in accordance with some embodiments of the present invention.

Reference is made to FIG. 3. In some embodiments of the present invention, the signal isolation device 100 further includes a plurality of the metal foils units 130, such as three metal foil units 130, and the metal foil units 130 are sequentially immediately adjacent to each other in a row along an axis X. The present invention is not limited in this respect. Specifically, the first recessed channels 131a and the second recessed channels 131b of the metal foil units 130 do not communicate with each other. Specifically, two immediately adjacent ones of the metal foil units 130 are in mirror symmetry. In some other embodiments of the present invention, one of the metal foil units 130 is in direct contact with another one of the metal foil units 130. The present invention is not limited in this respect.

Figure 4:
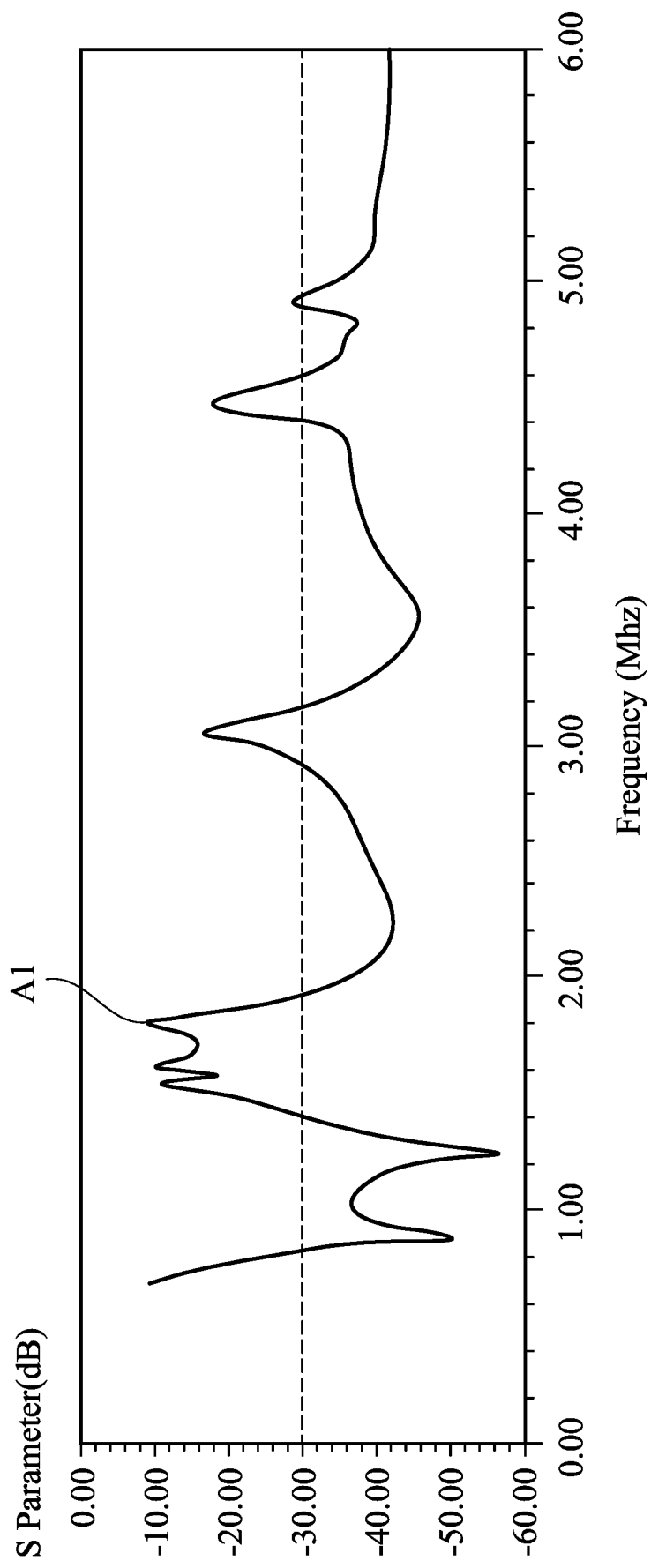
FIG. 4 illustrates a comparison diagram of return loss of the signal isolation device in accordance with some embodiments of the present invention.

Reference is next made to FIG. 4, which illustrates a comparison diagram of return loss of the signal isolation device 100, and a curved line A1 in FIG. 4 shows that the S Parameters of the signal isolation device 100 are below −40 dB in various frequency bands. For instance, the S Parameters corresponding to the frequency bands from 800 MHz to 1 GHz, from 2.4 GHz to 2.5 GHz, from 3.55 GHz to 3.7 GHz, and from 5.15 GHz to 5.85 GHz, are below −40 dB, and thus the signal isolation device 100 has outstanding signal isolation abilities in various frequency bands.

Figure 5:
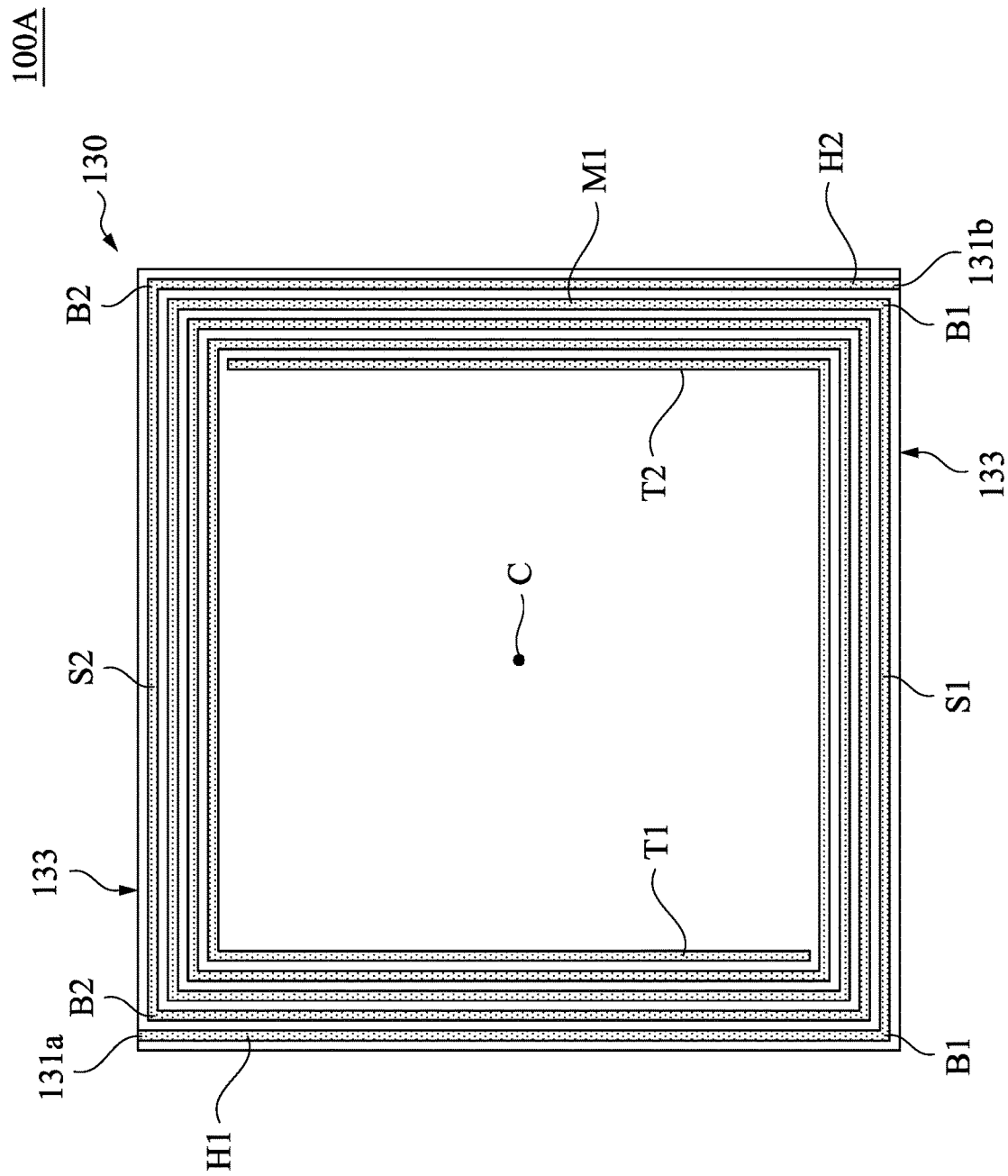
FIG. 5 illustrates a signal isolation device in accordance with some other embodiments of the present invention.

Reference is made to FIG. 5, which illustrates a top view of a signal isolation device 100A. The signal isolation device 100A is substantially the same as the signal isolation device 100, and a major difference between the signal isolation device 100 and the signal isolation device 100A is that the first recessed channel 131a of the signal isolation device 100A is closer to the center C than the first recessed channel 131a of the signal isolation device 100. In addition, the first recessed channel 131a of the signal isolation device 100A has an overall length greater than an overall length of the first recessed channel 131a of the signal isolation device 100. Moreover, the second recessed channel 131b of the signal isolation device 100A is closer to the center C of the second recessed channel 131b of the signal isolation device 100, and thus the second recessed channel 131b of the signal isolation device 100A has an overall length greater than an overall length of the second recessed channel 131b of the signal isolation device 100. The present invention is not limited in this respect. Specifically, the first recessed channel 131a of the signal isolation device 100A includes eight vertical bending portions B1 and nine straight portions S1, and each of the vertical bending portions B1 is disposed between two adjacent ones of the straight portions S1. The second recessed channel 131b includes eight vertical bending portions B2 and nine straight portions S2, and each of the vertical bending portions B2 is disposed between two adjacent ones of the straight portions S2. The present invention is not limited in this respect.

Figure 6:
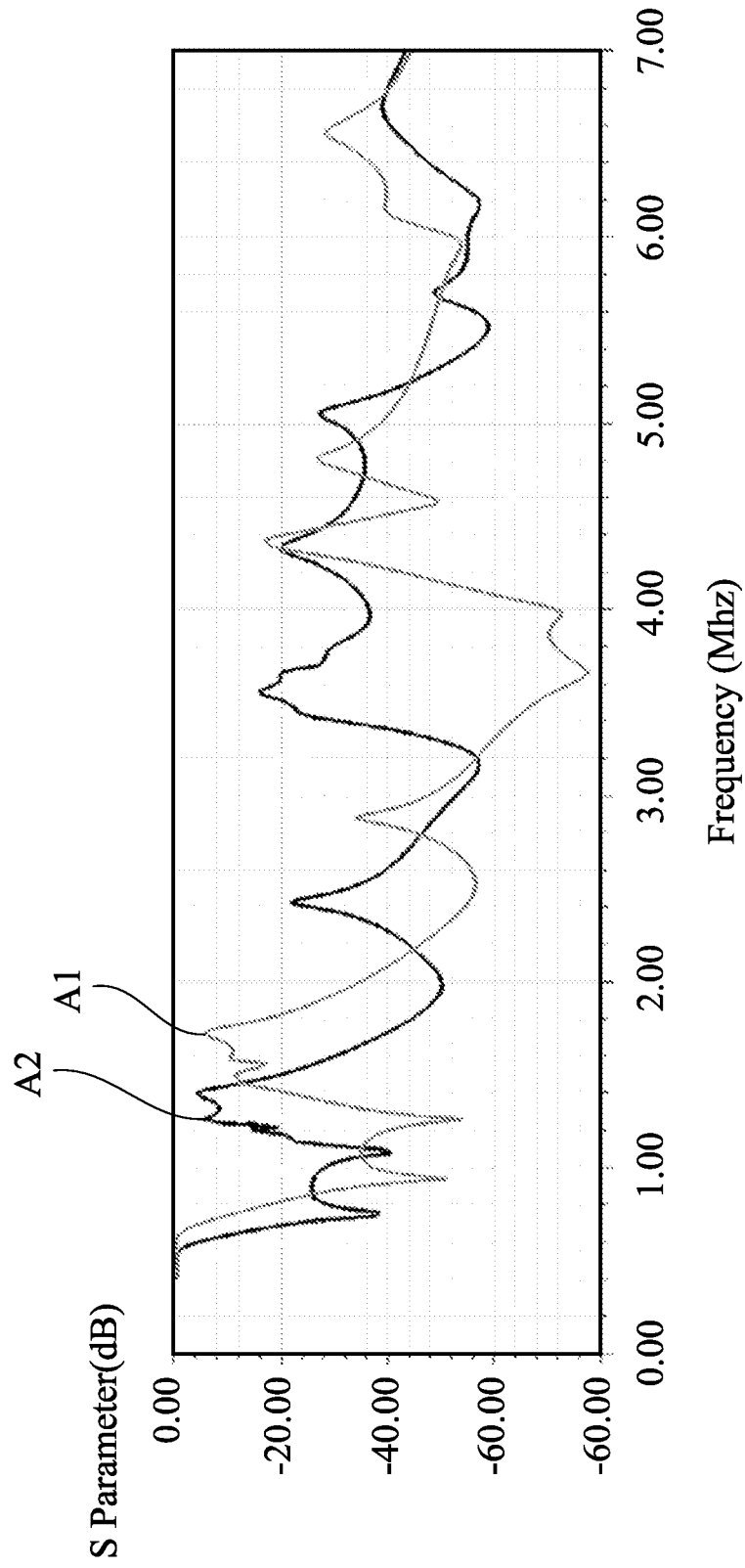
FIG. 6 illustrates a comparison diagram of return loss of the signal isolation devices in accordance with some embodiments of the present invention.

Reference is made to FIG. 6, which illustrates comparison diagram of return loss of the signal isolation device 100 and the signal isolation device 100A, and the curved line A1 and the curved line A2 can respectively represent the signal isolation device 100 and the signal isolation device 100A. According to FIG. 6, in comparison with the signal isolation device 100, the signal isolation device 100A can provide signal isolation function in lower frequency bands, and the first recessed channel 131a and the second recessed channel 131b of the signal isolation device 100 can be broadened and lengthened to form the signal isolation device 100A by a laser cutting process or an etching process. As can be known, the signal isolation device 100A in the present invention can be manufactured by easy processes, so as to adjust the signal isolation abilities thereof.

In embodiments of the present invention, a signal isolation device is provided, and the signal isolation device includes one single layer structure. The signal isolation device has outstanding signal isolation abilities in various frequency bands with a simple structure. Users can easily adjust the length of the recessed channel in the metal foil of the signal isolation device, and the signal isolation device can provide isolation functions in low frequency bands.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A signal isolation device, comprising:
an insulation layer;
a metal foil unit disposed on a top surface of the insulation layer, wherein the metal foil unit has a first recessed channel and a second recessed channel, the first recessed channel and the second recessed channel spirally extend inward from an edge of the metal foil unit, and wherein the first recessed channel and the second recessed channel surrounding each other are spaced apart, wherein the first recessed channel has a straight middle portion disposed between a straight head portion and a straight tail portion of the second recessed channel; and
a metal layer disposed on a bottom surface of the insulation layer.

2. The signal isolation device of claim 1, wherein the metal foil unit is square, and the first recessed channel and the second recessed channel extend from two opposite sides of the metal foil unit respectively.

3. The signal isolation device of claim 1, wherein the second recessed channel has a straight middle portion disposed between a straight head portion and a straight tail portion of the first recessed channel.

4. The signal isolation device of claim 1, wherein the first recessed channel and the second recessed channel have a plurality of right angle bending portions.

5. The signal isolation device of claim 1, wherein the first recessed channel and the second recessed channel are in a rotational symmetry around a center of the metal foil unit.

6. The signal isolation device of claim 1, wherein the first recessed channel has a width equal to a width of the second recessed channel.

7. The signal isolation device of claim 1, wherein a width of the first recessed channel is from 0.8 mm to 1.2 mm.

8. The signal isolation device of claim 1, wherein the first recessed channel has a portion immediately adjacent to and spaced apart from a portion of the second recessed channel by a minimum distance from 0.8 mm to 1.2 mm.

9. The signal isolation device of claim 1, further comprising additional metal foil units which are immediately adjacent to the metal foil unit and arranged along a row.

10. A signal isolation device, comprising:
an insulation layer;

a plurality of metal foil units disposed on a top surface of the insulation layer, wherein each metal foil unit has a first recessed channel and a second recessed channel, the first recessed channel and the second recessed channel spirally extend inward from an edge of the metal foil unit toward a center of the metal foil unit, and wherein the first recessed channel and the second recessed channel surrounding each other are spaced apart, wherein the first recessed channel has a straight middle portion disposed between a straight head portion and a straight tail portion of the second recessed channel; and a metal layer disposed on a bottom surface of the insulation layer.

11. The signal isolation device of claim 10, wherein the second recessed channel has a straight middle portion disposed between a straight head portion and a straight tail portion of the first recessed channel.

12. The signal isolation device of claim 10, wherein the first recessed channel and the second recessed channel are in a rotational symmetry around the center of the metal foil unit.

13. The signal isolation device of claim 10, wherein the metal foil units are immediately adjacent to each other and arranged along a row.

14. A signal isolation device, comprising:

an insulation layer;

a plurality of metal foil units disposed on a top surface of the insulation layer, wherein one of the metal foil units is in direct contact with another one of the metal foil units, and each metal foil unit has a first recessed channel and a second recessed channel, the first recessed channel and the second recessed channel spirally extend inward from an edge of the metal foil unit, and wherein the first recessed channel and the second recessed channel surrounding each other are spaced apart, wherein the first recessed channel has a straight middle portion disposed between a straight head portion and a straight tail portion of the second recessed channel; and a metal layer disposed on a bottom surface of the insulation layer.

15. The signal isolation device of claim 14, wherein the second recessed channel has a straight middle portion disposed between a straight head portion and a straight tail portion of the first recessed channel.

16. The signal isolation device of claim 14, wherein the first recessed channel and the second recessed channel are in a rotational symmetry around a center of the metal foil unit.

17. The signal isolation device of claim 14, wherein the first recessed channel has a width equal to a width of the second recessed channel.

* * * * *